United States Patent [19]

Nojiri et al.

[11] Patent Number: 4,503,528
[45] Date of Patent: Mar. 5, 1985

[54] METHOD AND APPARATUS FOR CONTROLLING VEHICLE MOUNTED DEVICES AND EQUIPMENT

[75] Inventors: Tadao Nojiri, Obu; Kenji Kanamaru; Masahiro Matsuyama, both of Chiryu; Takayoshi Nishikawa; Yoji Ito, both of Kariya, all of Japan

[73] Assignee: Nippondenso Co., Ltd., Kariya, Japan

[21] Appl. No.: 354,045

[22] Filed: Mar. 2, 1982

[30] Foreign Application Priority Data

Mar. 5, 1981 [JP] Japan ................... 56-32166

[51] Int. Cl.$^3$ .................. H04Q 9/00; B60Q 1/00; H04B 1/46; G10L 1/04
[52] U.S. Cl. ................... 367/198; 340/52 F; 340/825.19; 340/825.24
[58] Field of Search ............... 367/198, 197; 340/825.22, 825.19, 825.24, 52 F

[56] References Cited

U.S. PATENT DOCUMENTS

| | | | |
|---|---|---|---|
| 4,214,229 | 7/1980 | Warner | 367/198 |
| 4,333,152 | 6/1982 | Best | 367/198 |
| 4,340,800 | 7/1982 | Ueda et al. | 367/198 |
| 4,389,109 | 6/1983 | Taniguchi et al. | 367/198 |
| 4,401,852 | 8/1983 | Noso et al. | 367/198 |

*Primary Examiner*—Donald J. Yusko
*Attorney, Agent, or Firm*—Cushman, Darby & Cushman

[57] ABSTRACT

A demand for a change in the operating condition of at least one of a plurality of vehicle mounted devices is issued by means of a single push button switch attached to the center of the steering wheel. When the vehicle occupant intends to manipulate a device such as a radio, stereo unit or an air conditioner, he depresses the switch to supply a microcomputer with a demand signal. The microcomputer produces an instruction signal with which a sound synthesizer produces sequential vocal announcements which are emitted via a speaker. The occupant depresses the switch again within a predetermined period of time after the emission of a vocal announcement naming a device intended to control so that the sound synthesizer now provides various manipulative information relating to the available manipulations of the selected device. The driver depresses the switch to issue responsive instructions in response to an announcement of desired manipulation. The microcomputer thus operates to produce necessary control signals which are fed to a corresponding control unit of the selected device. A sound recognizer may be used in place of or together with the switch to detect the demand and responsive instructions from the driver.

35 Claims, 10 Drawing Figures

METHOD AND APPARATUS FOR CONTROLLING VEHICLE MOUNTED DEVICES AND EQUIPMENT

BACKGROUND OF THE INVENTION

This invention relates generally to method and apparatus for controlling various devices and equipment mounted on a vehicle, such as an automobile, and more particularly, the present invention relates to control of vehicle mounted devices whose operating conditions can be changed as desired.

Conventionally, changes of operating conditions of various devices and equipment in an automobile, for instance, a radio receiver, a stereo unit, an air conditioner or the like, have been effected manually by the occupant of the automobile. Namely, when the driver or the passenger of the motor vehicle intends to listen to a radio, he manually turns on the switch of the radio, and then he tunes the radio to a desired broadcasting frequency. Furthermore, he may manipulate the sound volume adjusting knob of the radio to set the sound volume to a desired level. In the same manner, when it is intended to operate a stereo unit or an air conditioning system of the motor vehicle, the occupant manipulates a corresponding switch or key to turn on a desired device, and then necessary adjustment, such as adjustment of temperature or the operating mode, is manually effected.

However, the manual operation of such switches, keys or the like tends to distract the vehicle driver from steering efforts to such an extent that it might lead to a dangerous situation. Therefore, there is a problem in that manipulation for changing the operating condition of the vehicle mounted devices cannot be effected readily when the motor vehicle is running. The main reason for the difficulty of manipulation of the switches or the like of such devices resides in the fact that the positions of the manipulative switches or the like cannot be accurately recognized by the driver since his attention is mainly paid to the front of the motor vehicle.

SUMMARY OF THE INVENTION

The present invention has been developed in order to provide a method and apparatus for controlling various devices and equipment mounted on a vehicle so that the vehicle driver is not bothered by manipulation of various switches, knobs or the like.

It is, therefore, an object of the present invention to provide a method and apparatus for automatically controlling various devices mounted on a vehicle with simple instructions from the occupant so that safe driving is ensured.

According to a feature of the present invention, sequential vocal announcements are emitted from a vehicle mounted speaker so that the vehicle occupant can selectively respond to a desired announcement. The announcements include various names of the devices to be operated and names of operations or manipulations to be performed. The occupant issues responsive instructions against an announcement when he wishes the named device to operate. The responsive instruction may be given either by manipulating a single switch or button or by pronouncing predetermined vocal sounds. In the case that the responsive instructions are given by vocal sounds, a sound recognizer responds to the vocal sounds to detect the contents thereof. Various operating conditions, such as tuning of a radio, sound volume control of the radio or a stereo unit, temperature control and operating mode control of an air conditioner, may be effected by supplying the vehicle occupant with corresponding information and by receiving responsive instructions from the occupant in the same manner.

Although the emobodiments of the present invention will be described in connection with the control of vehicle mounted devices, the invention may be adapted to control devices in a factory, plant or the like so that a number of manipulations of various devices can be simply controlled with a single switch or by talking to a vocal sound responsive unit.

In accordance with the present invention there is provided a method of controlling devices each having at least one manipulative element, comprising the steps of: detecting an action of an operator indicating that a demand has occurred for a change in operating conditions of at least one of said devices which are arranged to operate under the control of predetermined instructions; emitting sequential vocal announcements each corresponding to the manipulations of manipulative elements of said devices in response to the detection of said action, each of said vocal announcements being emitted at an interval to allow the operator to issue responsive instructions; monitoring said responsive instructions from the operator for a predetermined period of time after the emission of each announcement; and changing the operating conditions of one of said devices by automatically operating one of said manipulative element which has been announced just before the receipt of said responsive instructions.

In accordance with the present invention there is also provided apparatus for controlling devices each having at least one manipulative element, comprising: control means for effecting manipulative control of each of said devices in accordance with manipulative instruction signals; means responsive to the action of an operator for receiving a demand for a change in operating conditions of at least one of said devices; vocal announcements emitting means for emitting sequential vocal sounds indicative of the names of said devices in response to the detection of said action, said vocal announcements being emitted at an interval to allow the operator to issue responsive instructions, said vocal announcements emitting means being capable of emitting sequential vocal sounds indicating the names of manipulative elements of each of said devices; means responsive to said responsive instructions from the operator for a predetermined period of time after the emission of each announcement for controlling said vocal announcement emitting means so that said vocal announcements indicating the names of said manipulative elements of one of said devices are emitted in a sequence when said responsive instructions are received within said predetermined period of time after the emission of each announcement indicative of one of said devices; and means for producing said manipulative instruction signals to cause said control means to effect a desired manipulation of said manipulative elements which has been announced just before the receipt of said responsive instructions which are received within said predetermined period of time.

BRIEF DESCRIPTION OF THE DRAWINGS

The object and features of the present invention will become more readily apparent from the following detailed description of the preferred embodiments taken in conjunction with the accompanying drawings in which.

The same or corresponding elements and parts are designated at like numerals throughout the drawings.

DETAILED DESCRIPTION OF THE INVENTION

Figure 1:
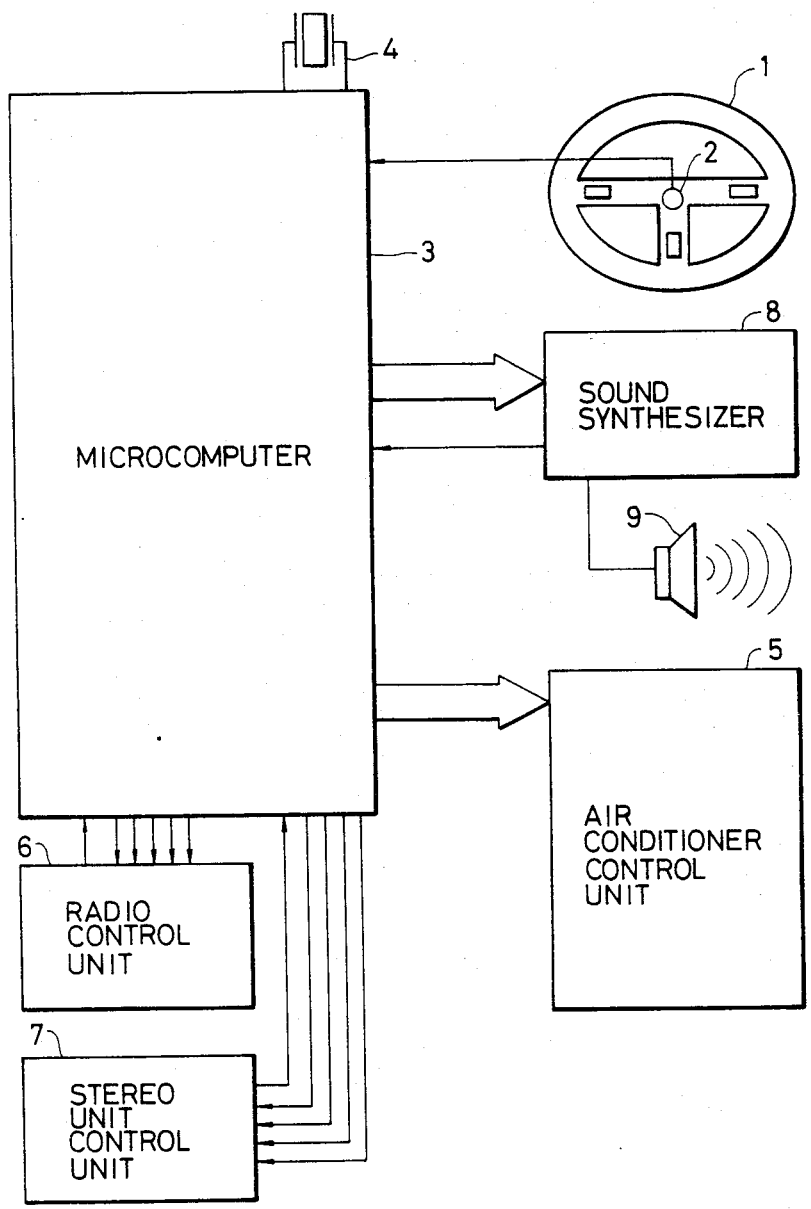
FIG. 1 is a schematic diagram showing the entire structure of an embodiment of the present invention.

Referring now to FIG. 1, a schematic diagram of an embodiment of the present invention is shown. The apparatus of FIG. 1, which is also used to perform the method according to the present invention, generally comprises a normally-open push button switch 2 attached to the center of the steering wheel 1 of a motor vehicle (not shown), a microcomputer 3, and a sound synthesizer 8 which supplies a vehicle mounted speaker 9 with synthesized vocal sounds.

The microcomputer 3 is responsive to a signal from the push button switch 2, which will be referred to as a manipulative switch hereafter. The manipulative switch 2 is provided for receiving a demand or instructions from an operator, such as the driver of the motor vehicle. A crystal resonator 4 is shown to be connected to the microcomputer 3 having the following components which are not shown: a central processing unit (CPU), a read-only memory (ROM), a random access memory (RAM), a clock generator, and input/output (I/O) devices. Namely the structure of the microcomputer is conventional so that it operates in accordance with a predetermined program stored in the ROM in a well known manner. The microcomputer 3 has output terminals connected to the sound synthesizer 8 and to various control units. In the illustrated embodiment, an air conditioner control unit 5, a radio control unit 6 and a stereo unit control unit 7 are shown to be connected to the outputs of the microcomputer 3. The microcomputer 3 also comprises input terminals for receiving signals indicative of the operating state of the radio and the stereo unit.

Although no power source is shown, the microcomputer 3 is arranged to receive a stabilized voltage via a voltage regulating circuit from the vehicle mounted battery.

In the above-mentioned ROM, are included regions M(0) to M(39) for storing instruction steps shown in the following table.

| | | | |
|---|---|---|---|
| M(0) | INST FOR SOUND "RADIO" | M(20) | SET TEMP CONTROL FLAG |
| M(1) | SET RADIO FLAG | | INST FOR SOUND "UP" |
| | INST FOR SOUND "TUNING" | M(21) | SET UP FLAG |
| M(2) | SET TUNING FLAG | M(22) | INST FOR SOUND "DOWN" |
| M(3) | INST FOR SOUND "POWER" | M(23) | SET DOWN FLAG |
| M(4) | SET POWER FLAG | M(24) | INST FOR SOUND "AIRFLOW RATE" |
| M(5) | INST FOR SOUND "SOUND VOLUME" | M(25) | SET AIRLOW RATE FLAG |
| M(6) | SET SOUND VOLUME FLAG | | INST FOR SOUND "UP" |
| | INST FOR SOUND "UP" | M(26) | SET UP FLAG |
| M(7) | SET UP FLAG | M(27) | INST FOR SOUND "DOWN" |
| M(8) | INST FOR SOUND "DOWN" | M(28) | SET DOWN FLAG |
| M(9) | SET DOWN FLAG | M(29) | INST FOR SOUND "OUTLET" |
| M(10) | INST FOR SOUND "STEREO UNIT" | M(30) | SET OUTLET FLAG |
| M(11) | SET STEREO UNIT FLAG | | INST FOR SOUND "VENTILATION" |
| | INST FOR SOUND "POWER" | M(31) | SET VENTILATION FLAG |
| M(12) | SET POWER FLAG | M(32) | INST FOR SOUND "HEATER" |
| M(13) | INST FOR SOUND "SOUND VOLUME" | M(33) | SET HEATER FLAG |
| M(14) | SET SOUND VOLUME FLAG | M(34) | INST FOR SOUND "BILEVEL" |
| | INST FOR SOUND "UP" | M(35) | SET BILEVEL FLAG |
| M(15) | SET UP FLAG | M(36) | INST FOR SOUND "DEFROSTER" |
| M(16) | INST FOR SOUND "DOWN" | M(37) | SET DEFROSTER FLAG |
| M(17) | SET DOWN FLAG | M(38) | INST FOR SOUND "AUTOMATIC" |
| M(18) | INST FOR SOUND "AIR CONDITIONER" | M(39) | SET AUTOMATIC FLAG |
| M(19) | SET AIR CONDITIONER FLAG | | |
| | INST FOR SOUND "TEMPERATURE" | | |

INST: INSTRUCTION

The air conditioner control unit 5 comprises therein an opening degree adjusting actuator for controlling the air mixing damper used for temperature adjustment, a motor drive circuit for driving the blower motor used for sending temperature-adjusted air to the automobile compartment, outlet switching actuator for changing the various operational modes of the temperature-adjusted air outlets. These devices are respectively controlled by various instruction signals from the microcomputer 3 so as to adjust the air in the automobile compartment.

The radio control unit 6 has a function of turning on and off the power source of the radio in response to a power source on-off instruction signal from the microcomputer 3, a function of adjusting the sound volume in response to a sound volume instruction signal from the microcomputer 3, and a function of automatically tuning in response to a tuning instruction signal from the microcomputer 3. The radio control unit 6 is arranged to send a signal indicative of on or off state of the power source of the radio to the microcomputer 3.

The stereo unit control unit 7 has a function of turning on and off the power source of the stereo unit in response to a power souce on-off instruction signal from the microcomputer 3, and a function of adjusting the sound volume in response to a sound volume instruction signal from the microcomputer 3. The stereo unit control unit 7 is arranged to send a signal indicative of on or off state of the power source of the stereo unit to the microcomputer 3.

The sound synthesizer 8 comprises a vocal sound data ROM for storing vocal sound data, which is used for emitting vocal sounds, in each predetermined region thereof. The sound synthesizer 8 is arranged to synthesize the contents of a predetermined region of the sound data ROM from the first address thereof in response to an instruction signal fed from the microcomputer 3, namely, in response to an address designation signal designating the first address of the predetermined region, to emit the synthesized vocal sound from the speaker 9, and is further arranged to send a vocal sound termination signal indicating the termination of sound synthesizing to the microcomputer 3 when reaching the last address of the predetermined region.

Figure 2:
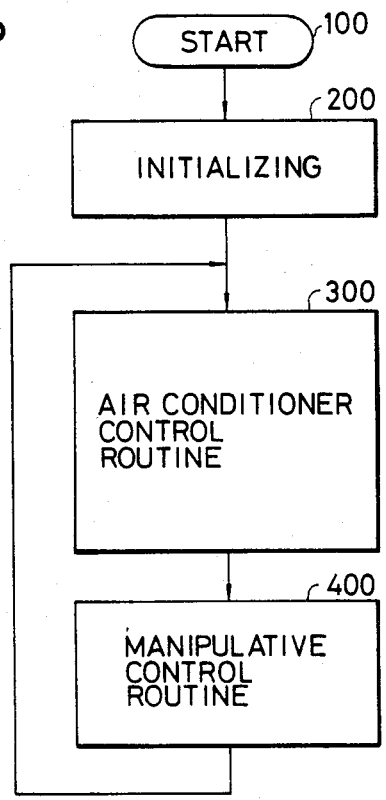
FIG. 2 is an operational flow chart showing the operational processing in the entire microcomputer of FIG. 1.
Figure 3:
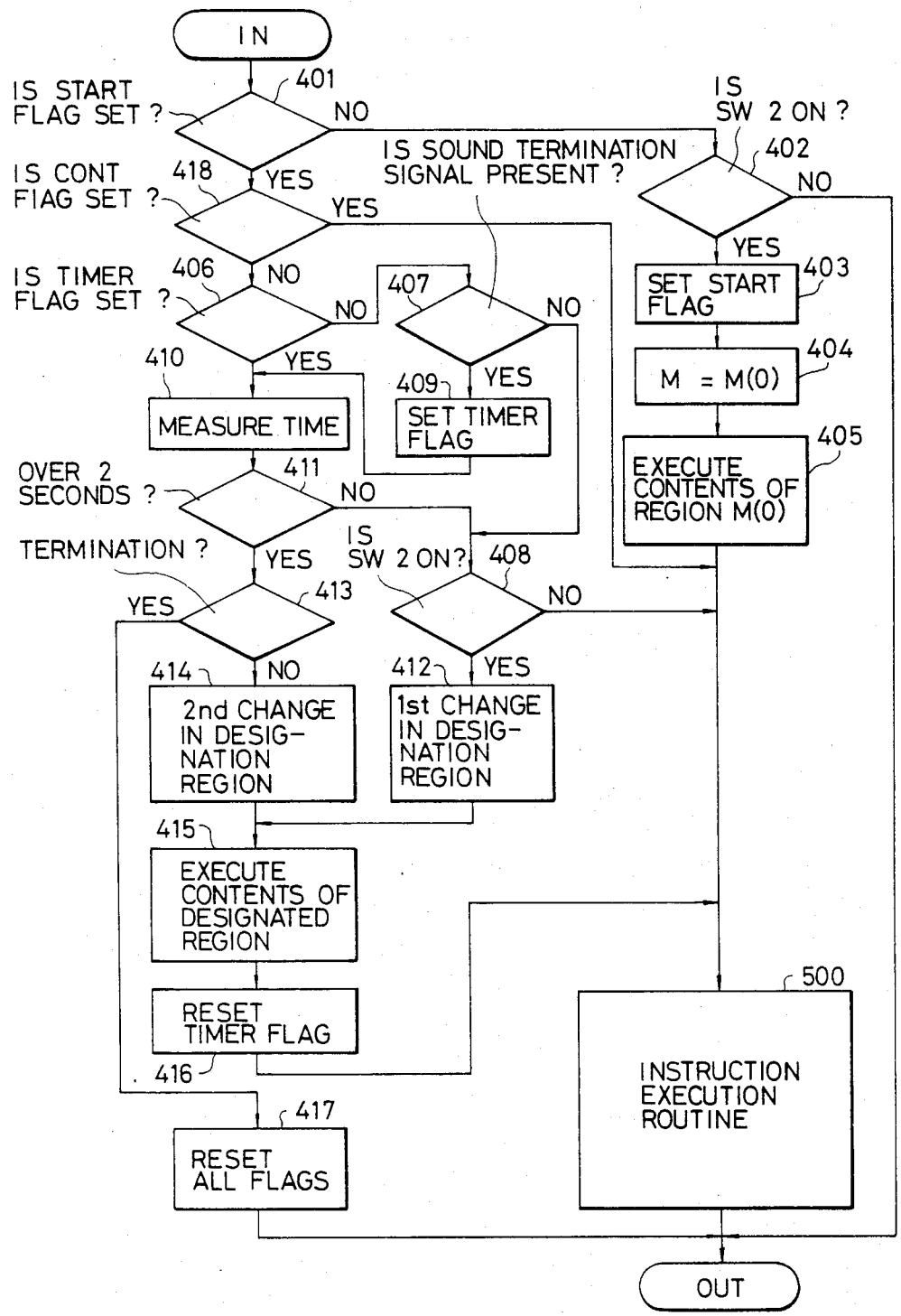
FIG. 3 is an operational flow chart showing a detailed operational processing in the manipulative control routine of FIG. 2.
Figure 4:
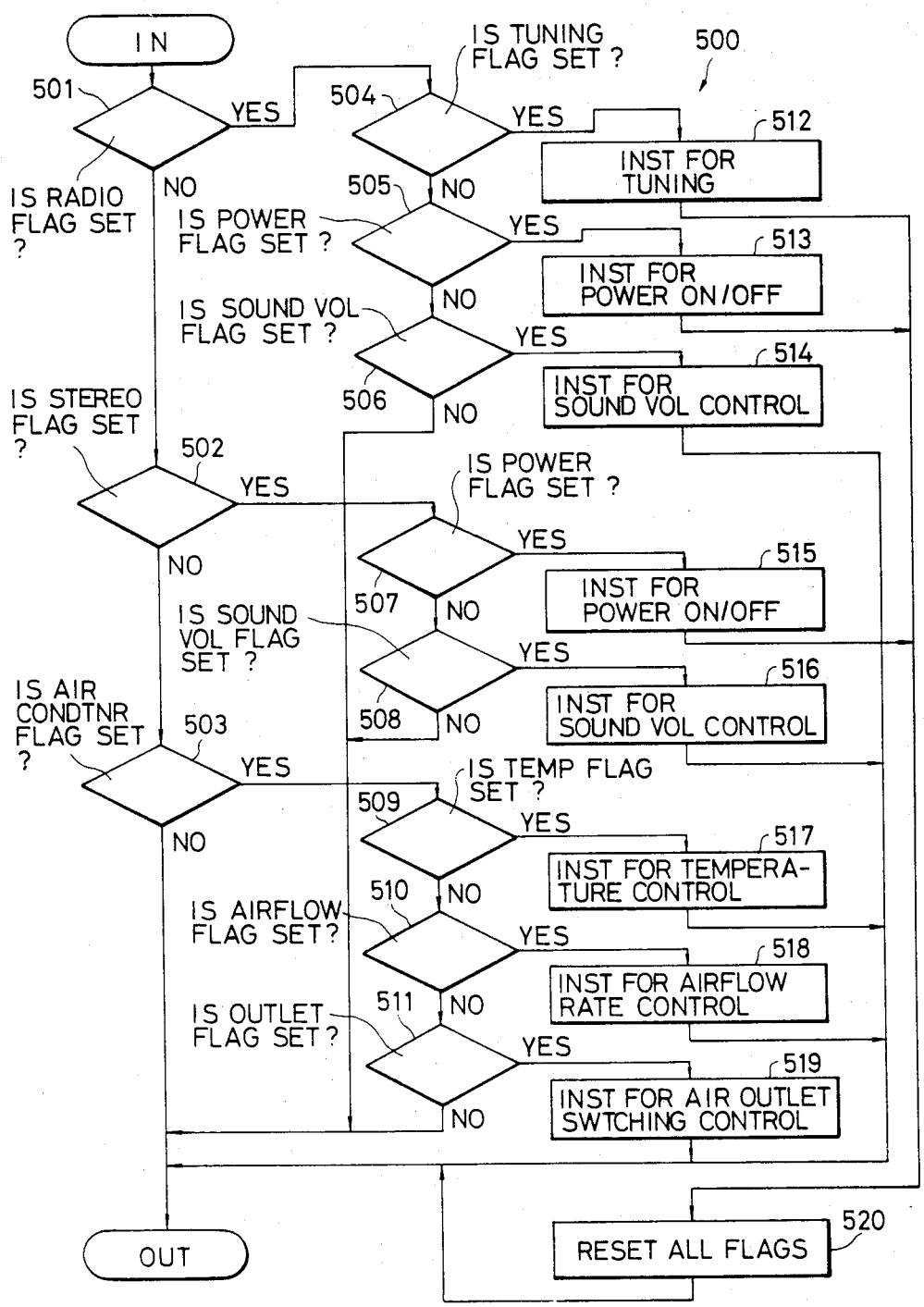
FIG. 4 is an operational flow chart showing a detailed operational processing of the instruction execution routine of FIG. 3.
Figure 5:
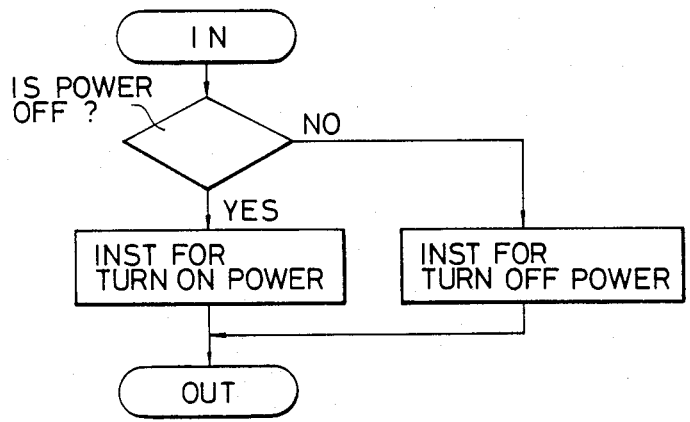
FIG. 5 is an operational flow chart showing a detailed operational processing of the power instruction routine of FIG. 4.

The operation of the apparatus of FIG. 1 will be described with reference to operational flow charts of FIGS. 2 to 9. FIG. 2 is an operational flow chart showing the entire operation of the microcomputer 3; FIG. 3, an operational flow chart showing detailed operation of the manipulative control operation routine in FIG. 2; FIG. 4, an operational flow chart showing detailed operation of instruction execution routine in FIG. 3; and FIGS. 5 to 9, operational flow charts showing detailed operations of respective instruction routines in FIG. 4.

When a key switch (not shown) is turned on in an automobile comprising the elements or devices 1 to 9 shown in FIG. 1 at the time of starting operation, electric power is supplied from the automobile battery to respective electrical systems to render the same active. The microcomputer 3 starts operating from the starting step 100 of FIG. 2 to set the registers, counters and latches in the microcomputer 3 to their initial conditions which are necessary for starting operation. The operation of setting to initial conditions includes a step of resetting all flags, which will be described later, and a step of setting initial values for airflow mode data, blow off mode data and so on. Operation of the main routine, which will be described hereinbelow, comprising an air conditioner control routine 300 and a manipulative control routine 400 is repeatedly executed at an interval of several hundreds of milliseconds.

In the air conditioner control routine 300, various instruction signals are sent to the opening degree adjuster, the motor drive circuit, and to the outlet switching atuator of the air conditioner control unit 5 by executing operational processing for pertinently controlling the air in the automobile compartment, namely by calculating the opening degree of the air mixing damper and the airflow rate data W etc. on the basis of detection signals from various sensors and temperature setting data T preset in a temperature setting circuit and airflow rate and blow off mode data based on mode information preset in an airflow rate and blow off mode setting circuit. The sensors for measuring inner and outer temperatures and for detecting air mixing damper opening degree, and the temperature setting circuit as well as the airflow and blow off mode setting circuits are not shown in FIG. 1 for simplicity. As a result of the operation, instruction signals are fed to the opening degree adjustment actuator of the air conditioner control unit 5, the motor drive circuit and the outlet switching actuator.

In a following manipulative control operation routine 400, the turn-on signal from the manipulative switch 2 is monitored, which turn-on signal indicates that a demand has occurred for a change in operating conditions of at least one of the devices 5, 6 and 7. When detecting the turn-on signal during monitoring, the names of various manipulations of the radio, stereo unit and the air conditioner are announced in a predetermined sequence. When another turn-on signal from the manipulative switch 2 is detected, an operation is executed so that an instruction signal is fed to an objective control unit, with which the instruction signal of the last announced manipulation will be performed.

FIG. 3 shows a detailed operational flow of the manipulative control routine 400. When reaching the manipulative control routine 400, if the manipulative switch 2 has never been turned on till this time, the answer of a starting flag deciding step 401, which comes first, assumes NO because all the flags used in the manipulative control routine 400 have been reset. Then the operational flow enters into a manipulative switch state deciding step 402, where the answer thereof assumes NO when the manipulative switch 2 has not been turned on, to terminate one cycle of the operation of the manipulative control routine 400. After this, the above-operation is executed whenever reaching the manipulative control operation routine 400 as long as the manipulative switch 2 is not turned on.

After this, when the manipulative switch 2 is turned on to change the power of the radio from OFF state to ON state, the level of the signal from the manipulative switch 2 varies to cause the answer of the manipulative switch state deciding step 402 of FIG. 3 to become YES. Then the operational flow goes to the starting flag setting step 403 to set the starting flag. Then entering into a designation region setting step 404 to set a designation region M to M(0), and the operational flow goes to an execution step 405 to execute the contents of the region M(0) of the ROM of the microcomputer 3. Namely, an instruction signal for announcing "RADIO" according to the ROM table is sent to the sound synthesizer 8, and the operational flow enters into an instruction execution routine 500. With this operation, the sound synthesizer 8 starts synthesing the vocal sound of "RADIO".

In the instruction execution routine 500, since all the radio flag, stereo unit flag and the air conditioner flag are all left in reset condition, which was done in the initial setting, the answers of the radio flag deciding step 501, the stereo unit flag deciding step 502 and the air conditioner flag deciding step 503 all assume NO to terminate one cycle of the operation.

When the operational flow reaches again the starting flag deciding step 401 of the manipulative control routine 400 of FIG. 3, the answer thereof becomes YES since the starting flag has been set. Because a continuation flag and a timer flag have been reset from the initial setting, the following continuation flag deciding step 418 and the timer flag deciding step 406 assume NO, and the operational flow enters into a vocal sound termination deciding step 407 where the answer thereof assumes NO because no vocal sound termination signal has been sent from the sound synthesizer 8. The operational flow enters into a manipulative switch state deciding step 408 whose answer assumes NO when the manipulative switch has not been turned on again. Thus, the operational flow enters into the instruction execution routine 500 to execute the above-described operation.

In the case that the vocal sound termination signal is not sent from the sound synthesizer 8 while the manipulative switch 2 is not turned on again, the above operation is repeatedly executed. When the sound synthesizer 8 completes synthesizing the vocal sound of "RADIO" and produces the vocal sound termination signal, the answer of the vocal sound termination deciding step 407 becomes YES when the operational flow reaches it. Then the operational flow enters into a timer flag setting step 409 to set the timer flag, and then goes to a time measuring step 410 to measure the time counting the number of times of reaching. As two seconds have not elapsed since entering into the time measuring step 410, the answer thereof assumes NO to go to the manipulation switch state deciding step 408. Accordingly, whenever the operational flow reaches the timer flag deciding step 406 from the next time, the operational flow directly goes to the time measuring step 410 because the timer flag has been set to cause the answer of decision thereof to become YES. Namely, it is made possible to accept responsive instructions via the manipulative switch 2 for the operation of the radio until two seconds will have passed from the emission of the vocal announcement of "RADIO".

When it is recognized by the operator, such as the vehicle driver, that the radio should be manipulated and the manipulative switch 2 is turned on before the lapse of two seconds, the answer of the manipulation switch deciding step 408 becoms YES as the operational flow reaches it to enter into a first designation region changing step 412. In the first designation region changing step 412, the designation regions are changed by one in connection with the designation region M according to the arrows shown below.

M(0)→M(1)→M(2), M(3)→M(4), M(5)→M(6) M(7),
M(8)→M(9),  M8(10)→M(11)→M(12),
M(13)→M(14)→M(15),  M(16)→M(17),
M(18)→M(19)→M(20)→M(21),  M(22)→M(23),
M(24)→M(25)→M(26),  M(27)→M(28),
M8(29)→M(30)→M(31),  M(32)→M(33),
M(34)→M(35), M(36)→M(37), M(38)→M(39)

Since the designation region M by that time has been M(0), the designation region M becomes M(1) after being changed. The operational flow enters into a next execution step 415 to execute the contents of M(1), where the radio flag is set according to the above-mentioned ROM table, and an instruction signal for announcing "TUNING" is sent to the sound synthesizer 8, while the timer flag is set. Then the operational flow goes to the timer flag setting step, and then goes to the instruction execution routine 500. With this operation, the sound synthesizer 8 starts synthesizing vocal sounds of "TUNING". When the operational flow reaches a radio flag deciding step 501 of the instruction execution routine 500, the answer thereof becomes YES to go to a tuning flag deciding step 504, power flag deciding step 505 and to a sound volume flag deciding step 506. Since all these flags have been reset from the initial setting, all the answers thereof assume NO to complete one cycle of operation.

When the operational flow reaches the timer flag deciding step 406 of FIG. 3, the answer thereof becomes NO because or the reset state of the timer flag, and thus the operational flow changes to enter into the instruction execution routine 500 via the vocal sound termination deciding step 407 and the manipulative switch state deciding step 408. When the sound synthesizer 8 completes synthesizing the vocal sound of "TUNING" and produces a sound termination signal, the operational flow goes from the vocal sound termination deciding step 407 to the timer flag setting step 409 to set the timer flag, and thus, the answer of the timer flag deciding step will be YES from the next time when the operational flow reaches it, and the operational flow goes via the time measuring step 410, time deciding step 411 and the manipulative switch deciding step 408 to the instruction execution routine 500.

When a period of time of two seconds passes without receiving the turn-on signal from the manipulative switch 2 with the operator's recognition that the emitted vocal sound of "TUNING" is different from one which the operator intended to manipulate, the answer of the time deciding step 411 becomes YES when the operational flow reaches it, and thus the operational flow goes to a termination deciding step 413. In the termination deciding step 413, it is decided whether or not the designation region M corresponds to one of M(5), M(8), M(13), M(16), M(18), M(22), M(27), M(29), M(38). Thus, the answer of the decision becomes NO because the designation region M by that time is M(1), and therefore, the operational flow goes to a second designation region changing step 414. In the second designation region changing step 414, the designation region M is changed by one in accordance with the following arrows.

M(0)→M(10)→M(18),  M(1)→M(3)→M(5),
M(6)→M(8),  M(11)→M8(13),  M(14)→M(16),
M(19)→M(24)→M(29),  M(20)→M(22),
M(25)→M(27),
M(30)→M(32)→M(34)→M(36)→M(38)

Since the designation region M has been M(1) by that time, the designation region M will be M(3) after being changed. Then the opeational flow goes to a next execution step 415 in which the contents of M(3) are executed, namely, an instruction signal for announcing "POWER" is sent according to the ROM table to the sound synthesizer 8, and the operational flow goes to the instruction execution routine 500 via a timer flag resetting step 416. With this operation the sound synthesizer 8 starts synthesizing the vocal sound of "POWER" to announce the same.

In the same manner as described in the above, it is monitored, in connection with the announcement of "POWER", to detect if the manipulative switch 2 is turned on until two seconds elapse. When the manipulative switch 2 is turned on with the operator's recognition that the power source should be turned on in response to the vocal sound emission, the answer of the manipulative switch state deciding step 408 becomes YES when the operational flow reaches it, and thus the operational flow goes to the first designation region changing step 412. Since the designation region M has been M(3) by that time, the designation region becomes M(4) after being changed according to the above-described changes. Then in the next executing step 415, the contents of M(4) of the ROM table, namely, the power flag is set. Accordingly, in the instruction execution routine 500 following the timer flag resetting step 416, when the operational flow reaches the power flag deciding step 505 of FIG. 4, the answer thereof becomes YES to go to a power instruction routine 513. In the power instruction routine 513, an instruction signal for the operational processing shown in FIG. 5, i.e. an instruction signal for changing the power condition in accordance with the power on-off state signal from the radio control unit 5, is sent to the radio control unit 5. Entering into an all-flag resetting step 520 of FIG. 4, all the flags necessary for operational processing in the manipulative control routine 400 are reset to complete one cycle of the operation. Therefore, when the operational flow reaches the starting flag deciding step 401 of FIG. 3 next time, which step is encountered first in the manipulative control routine 400, the answer thereof becomes NO to assume the same condition as initial condition described in the above. The radio control unit 5 puts the radio power source in ON state in response to the power-on instruction signal.

In the case that the manipulative switch 2 is turned on to tune the radio and then the manipulative switch 2 is again turned on when the vocal sound of "TUNING" is emitted. the tuning flag is set because the designation region M is changed to M(2) in the first designation region changing step 412. Consequently, when the operational flow reaches the tuning flag deciding step 504, the answer thereof becomes YES to go to the tuning instruction step 512 in which a tuning instruction is sent to the radio control unit 5. With this operation. the radio control unit 5 causes the radio to be tuned.

Figure 6:
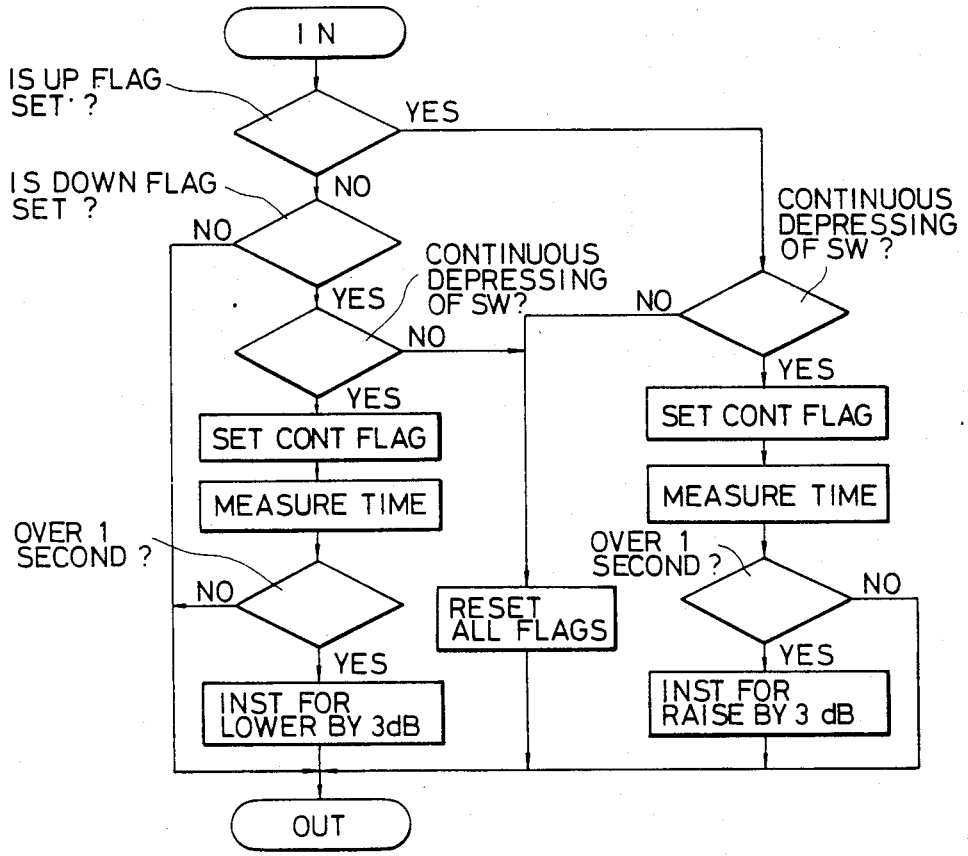
FIG. 6 is an operational flow chart showing a detailed operational processing of the sound volume adjustment routine of FIG. 4.

Suppose the manipulative switch 2 is turned on to adjust the sound volume of the radio so that the designation region M is changed from M(3) to M(5) in the second designation region changing step 415 after vocal sounds of "RADIO", "TUNING" and "POWER" are emitted. If the manipulative switch 2 is again turned on when the vocal sound of "SOUND VOLUME" is emitted. the designation region M is changed from M(5) to M(6) in the first designation region changing step 412. Then a sound volume flag is set in the execution step 415 while an intruction for vocal sound of "UP" is sent to the sound synthesizer 8. Therefore, when the operational flow reaches a sound volume flag deciding step 506 of FIG. 4, the answer thereof becomes YES to go to a sound volume adjustment instruction routine 514 in which operational processing shown in FIG. 6 is executed, and no sound volume instruction occurs since neither the up flag or down flag has been set. When the manipulative switch 2 is continously depressed to be turned on in response to the emission of the sound of "UP", the up flag will be set because the designation region M is changed to M(7) in the first designation region changing step 412. With this operation, the continuation flag is set and simultaneously, an instruction signal, with which increase by 3 dB per one second will result, is sent to the radio control unit 5 in the sound volume adjustment instruction routine 514 of FIG. 6. As a result, the sound volume of the radio increases more and more. The increase in sound volume stops by cancelling the turn-on state of the manipulative switch 2, and all the flags necessary for operational processing in the manipulative control routine 400 are reset. In order to decrease the sound volume, the manipulative switch 2 may be continously turned on in response to the vocal sound of "DOWN" which is emitted after "UP", so that decrease by 3 dB per one second will result in the same manner as described above.

Namely, it is possible to emit various vocal sounds in a predetermined sequence in accordance with the contents of the above-mentioned ROM table, the first designation region changing step 412 and the second designation region changing step 414, while changes in operation in various manipulating elements can be efected by turning on the manipulative switch 2 at an appropriate time.

For instance, in the case of operating the stereo unit, the manipulative switch 2 is not turned on in response to the emission of the vocal sound of "RADIO", but is turned on in response to the sound of "STEREO UNIT" which is emitted subsequently. Thus, the stereo unit flag is set so that the answer of the stereo unit flag deciding step 502 of FIG. 4 becomes YES. When the manipulative switch 2 is turned on in response to the sound of "POWER" emitted after this, the power flag is set so that the answer of the power flag deciding step 507 becomes YES when the operational flow reaches it, and the operational flow goes to a power instruction step 515 to produce a power on/off instruction signal (this is done by the same operating process as in FIG. 5) to turn on or off the stereo unit. When it is intended to adjust the sound volume rather than the on/off operation of power, the manipulative switch 2 is not manipulated at all in response to the emission of the vocal sound of "POWER", but the manipulative switch 2 is again turned on in response to the sound of "SOUND VOLUME" which is emitted subsequently, the sound volume flag is set to cause the answer of the sound volume flag deciding step 508 to assume YES when the operational flow reaches it. The operational flow goes to a sound volume adjustment instruction routine 516 and the same operating processing as in FIG. 6, namely an operating processing for sending an instruction signal with which increase or decrease by 3dB per one second is effected when the manipulative switch is continously turned on in response to "UP" or "DOWN" to the stereo unit control unit 6, is executed.

Figure 7:
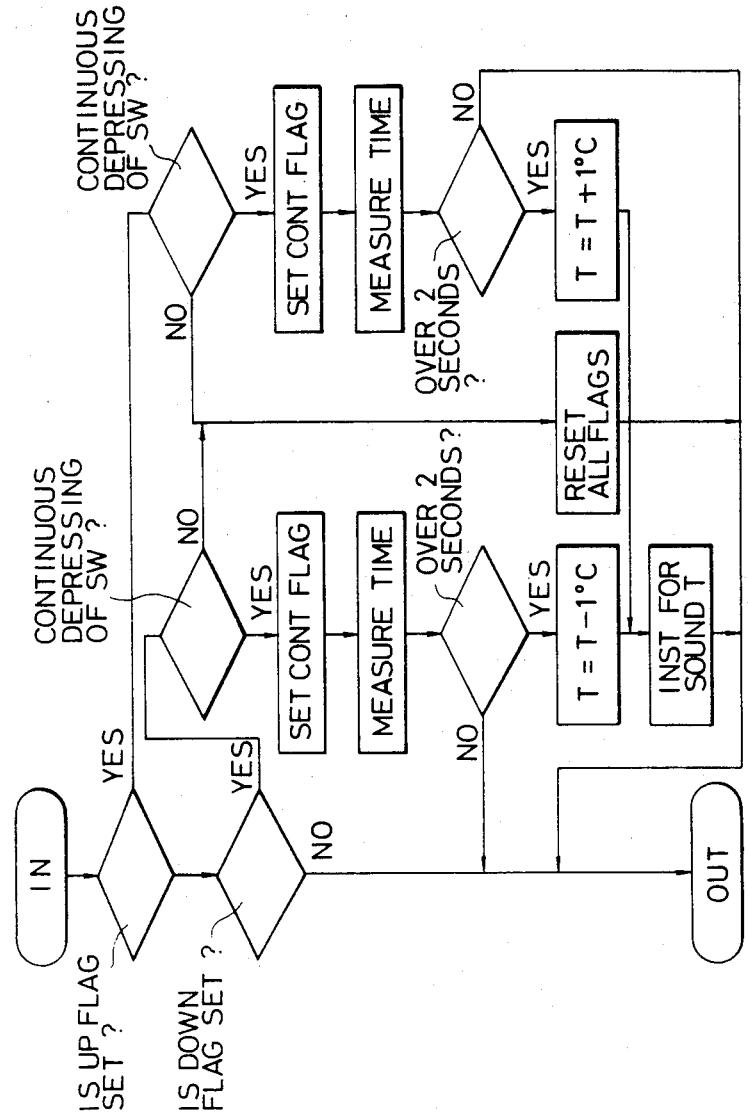
FIG. 7 is an operational flow chart showing a detailed operational processing of the temperature control instruction routine of FIG. 4.

On the other hand, in the case of operating the air conditioner, the manipulative switch 2 is not turned on in response to the emission of sounds of "RADIO" and "STEREO UNIT", but is turned on in response to emission of vocal sound "AIR CONDITIONER" which is emitted subseqently, and thus the air conditioner flag is set so that the answer of the air conditioner flag deciding step 503 of FIG. 4 becomes YES. When the manipulative switch 2 is turned on in response to the vocal sound of "TEMPERATURE" which is emitted subsequently, temperature control flag is set so that the answer of the temperature control flag deciding step 509 becomes YES when the operational flow reaches it. Thus, the operational flow goes to a temperature control instruction routine 517 in which the operating processing of FIG. 7 is executed in the same manner as in the case of sound volume adjustment shown in FIG. 6. Namely, when the manipulative switch 2 is continuously depressed to be turned on in response to the emission of the sound of "UP" or "DOWN", the predetermined temperature data T is either raised or lowered by 1 degree centigrade per two seconds, and an instruction signal for emitting the vocal sound of the value of the changed, i.e. raised or lowered, temperature is sent to the sound synthesizer 8. Accordingly, air conditioning is effected so that the temperature in the automobile compartment approaches the changed temperature setting by executing the air conditioner control routine 300 with respect to the changed temperature setting data T.

Figure 8:
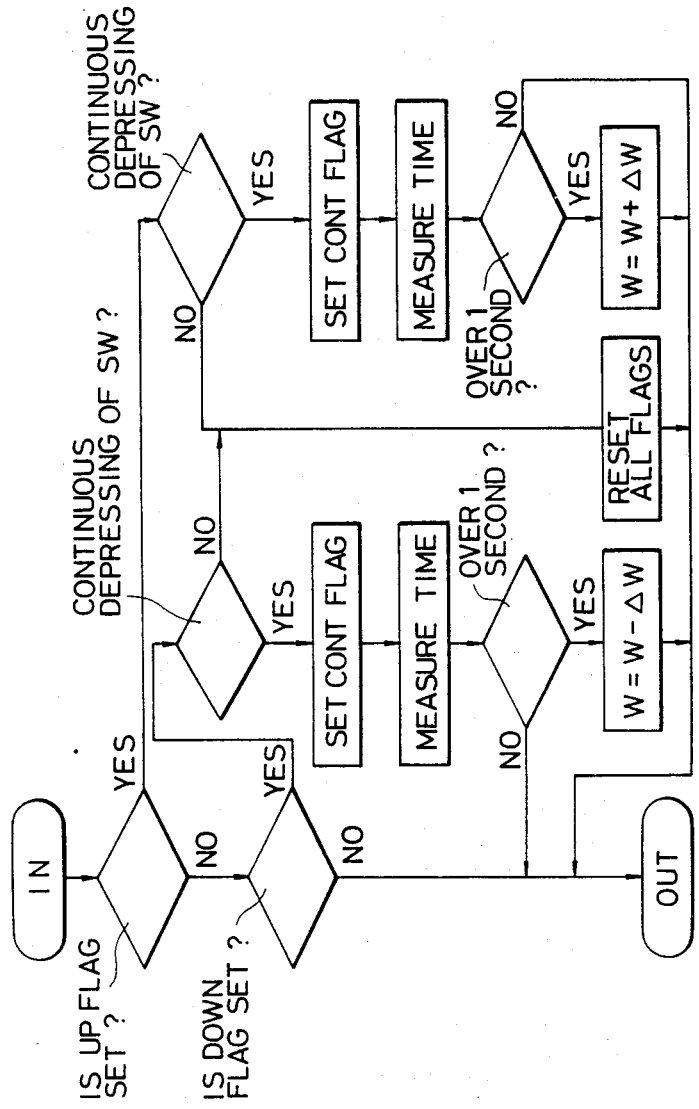
FIG. 8 is an operational flow chart showing a detailed operational processing of the airflow rate control instruction routine of FIG. 4.
Figure 9:
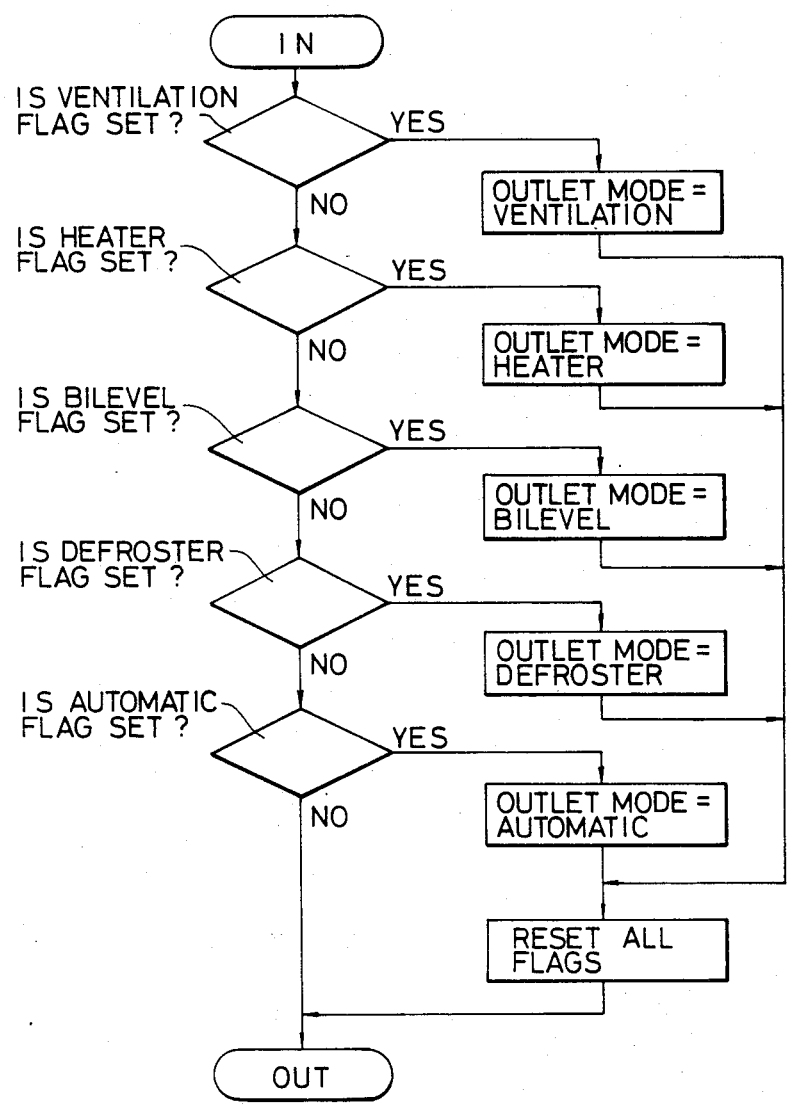
FIG. 9 is an operational flow chart showing a detailed operational processing of the air outlet switching routine of FIG. 4.

In the case of adjusting the airflow rate rather than the temperature adjustment, the manipulative switch 2 is not manipulated at all in response to "TEMPERATURE". The manipulative switch 2 is turned on in response to the announcement of "AIRFLOW" which is emitted subsequently, and thus an airflow flag is set to cause the answer of an airflow flag deciding step 510 to become YES when this step is encountered. Then the operational flow goes to an airflow adjustment instruction routine 518 in which the operational processing shown in FIG. 8 is executed in the same manner as in the cases of FIG. 6 and FIG. 7. Namely, when the manipulative switch 2 is continuously turned on in response to the emission of the sound of "UP" or "DOWN", an operational process is executed to increase or decrease an airflow rate data W by ΔW per one second. Therefore, the airflow rate is either increased or decreased by executing the operational process of the air conditioner control routine 300 of FIG. 2 with respect to the changed airflow rate data W.

In the case of changing the air outlets rather than the temperature adjustment and the airflow rate adjustment, the manipulative switch 2 is not manipulated at all in response to "TEMPERATURE" and "AIRFLOW", but is manipulated again in response to "OUTLETS" emitted subsequently so that the outlet flag is set. Therefore, when the operational flow reaches an outlet flag deciding step 511, the answer thereof become YES to go to an outlet switching routine 519. If the manipulative switch 2 is not manipulated at all after reaching the outlet switching routine 519, vocal sounds of "VENTILATION", "HEATER", "BILEVEL", "DEFROSTER" and "AUTOMATIC" are emitted one after another. Thus, when the manipulative switch 2 is turned on in response to a vocal sound emission corresponding to an operating mode in which a change should be made, the corresponding flag is set so that an outlet mode data is changed in the operating process of FIG. 9. Accordingly, the outlets are switched in accordance with the changed mode by executing the air conditioner control routine 300 of FIG. 2 with respect to the corrected outlet mode.

On the other hand, when the operational flow reaches the termination deciding step 413 with the designation region M being M(5), M(8), M(13), M(16), M(18), M(22), M(27), M(29), M(38), while the manipulative switch 2 has not been turned on again in response to emission of a vocal sound of a manipulative element to be changed or the like, namely, when two seconds have elapsed without receving the turn-on signal from the manipulative switch 2 after the emission of one of the vocal sounds of "SOUND VOLUME", "DOWN", "AIR CONDITIONER", "OUTLET" and "AUTOMATIC", the answer of the termination deciding step 413 becomes YES. Then the operational flow goes to the all-flag resetting step 417 to reset all the flags necessary for operational processing of the manipulative control routine 400, so that the operational processing for manipulative control returns to the above-mentioned initial condition.

Figure 10:
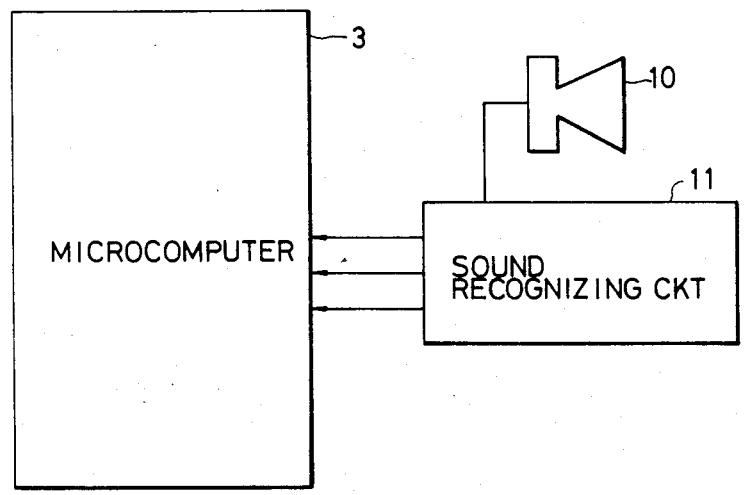
FIG. 10 is a partial structural view of another embodiment.

In the above-described embodiment, although the manipulative switch 2, which is manually operable, is used to produce a demand or instruction signal, it may be possible to receive the demand or instructions from the operator by recognizing the vocal sounds of "CHANGE", "YES" or "NO" of the driver or others by employing a sound recognizing circuit 11 with a microphone 10 provided in the vicinity of the steering wheel as shown in FIG. 10. The sound recognizer 11 detects a plurality of predetermined vocal words separately to send corresponding recognition signals to the microcomputer 3. Furthermore, both sound recognition and switch manipulation may be used.

Although an example, in which the order of emission of sounds is predetermined, has been described, the order of vocal sound emission may be changed by providing a fast feeding switch or the like, or by arranging such that vocal sound emission takes place immediately after the last vocal sound emission. Furthermore, it may be possible to arrange such that vocal sounds which are needed frequently are emitted preferentially.

Furthermore, the various manipulative elements to be controlled are not limited to those described above, and therefore, they may include wiper switch, head light switch or the like.

Furthermore, although the sound synthesizer 8 has been described as a vocal announcement emitting means, it is possible to use a device utilizing a magnetic recording tape or the like in which words to be pronounced have been prerecorded.

From the foregoing description, it will be understood that various devices mounted on a motor vehicle or the like can be readily and accurately controlled by issuing instructions by means of a manually operable switch or by pronouncing predetermined vocal words. Since there is no need to manipulate various switches or keys to turn on, to adjust or to select a desired operating mode of the device which the vehicle driver intends to operate, the vehicle driver can concentrate on driving the vehicle, and thus safe driving can be ensured.

The above-described embodiments are just examples of the present invention, and therefore, it will be apparent for those skilled in the art that many modifications and variations may be made without departing from the spirit of the present invention.

What is claimed is:

1. A method of controlling a device mounted on a motor vehicle for automatically changing operating conditions of first and second manipulative elements inherent to said device, comprising:
   (a) a first step of detecting start-indication from a passenger of said motor vehicle, which start-indication is indicative of a demand for a change in operating conditions of said device;
   (b) a second step of emitting vocal announcement indicative of said first manipulative element to compartment of said motor vehicle in response to said detection in said first step;
   (c) a third step of determining whether instructions from said operator responding to said vocal announcement of said second step is received within a predetermined period of time after said vocal announcement of said second step;
   (d) a fourth step of changing the operating condition of said first manipulative element when said instructions are received at said third step;
   (e) a fifth step of emitting vocal announcement indicative of said second manipulative element to said compartment when said instructions are not received at said third step;
   (f) a sixth step of determining whether instructions from said operator responding to said vocal announcement of said fifth step is received within a predetermined period of time after said vocal announcement of said fifth step;

(g) a seventh step of changing the operating condition of said second manipulative element when said instructions are received at said fifth step.

2. A method as claimed in claim 1, wherein said first step is performed by detecting a predetermined condition of a manually operable switch.

3. A method as claimed in claim 2, wherein said third step is performed by detecting a predetermined condition of said switch.

4. A method as claimed in claim 1, wherein said first step is performed by detecting a predetermined vocal demand from said passenger.

5. A method as claimed in claim 4, wherein said third step is performed by detecting a predetermined vocal word from said passenger by using the same sound recognizer as that used for detecting said vocal demand.

6. A method as claimed in claim 1, wherein said step of emitting vocal announcements comprises a step of synthesizing at least one predetermined vocal word by selectively reading the contents of a memory in which data corresponding to various vocal words indicative of said manipulations is stored respectively in a plurality of regions of said memory.

7. A method as claimed in claim 6, further comprising a step of changing a designation region with which predetermined contents of a predetermined region in said memory are read out.

8. A method as claimed in claim 7, wherein said step of changing the designation region is performed by changing said designation region by one to a next region in a sequence predetermined for each of said regions.

9. A method as claimed in claim 8, wherein said step of changing the designation region is performed when said responsive instructions are detected within said predetermined period of time.

10. A method as claimed in claim 9, further comprising another step of changing the designation region in a different manner from the first-mentioned changing step, said another step of changing being performed when said responsive instructions are not detected within said predetermined period of time, while the designation region assumes one of predetermined designation regions.

11. A method as claimed in claim 10, wherein said another step of changing the designation region is performed to change said designation region by one.

12. A method as claimed in claim 1, wherein said third step is performed by detecting a predetermined condition of a manually operable switch.

13. A method as claimed in claim 1, wherein said third step is performed by detecting a predetermined vocal demand from said passenger.

14. A method as claimed in claim 1, wherein said second and fifth steps respectively comprise a step of emitting a vocal sound only when no responsive instruction is detected within said predetermined period of time.

15. A method as claimed in claim 1, wherein said operating conditions to be controlled includes on/off operation, tuning and sound volume control of a radio mounted on a motor vehicle.

16. A method as claimed in claim 1, wherein said operating conditions to be controlled includes on/off operation and sound volume control of a stereo unit mounted on a motor vehicle.

17. A method as claimed in claim 1, wherein said operating conditions to be controlled includes on/off operation, temperature adjustment, airflow rate control and air outlet switching of an air conditioning system mounted on a motor vehicle.

18. A method as claimed in claim 1, further comprising the steps of:

(a) emitting vocal announcements indicative of remaining manipulative elements of said device to said compartment in sequence; and (b) terminating automatic change operations when a predetermined period of time has lapsed after announcement indicating a last manipulative element.

19. A method of controlling a plurality of devices mounted on a motor vehicle for automatically changing operating conditions of a plurality of manipulative elements inherent to each of said devices by designating a particular device among said plurality of devices, comprising:

(a) a first step of detecting start-indication from a passenger of said motor vehicle, which start-indication is indicative of a demand for effecting automatic change;

(b) a second step of emitting vocal announcement indicative of said plurality of devices in sequence from a first device to a compartment of said motor vehicle, where the order of said devices to be announced is predetermined;

(c) a third step of determining whether instructions from said operator responding to said vocal announcement of said second step is received within a predetermined period of time after said vocal announcement of said second step;

(d) a fourth step of emitting vocal announcement indicative of a next device to said compartment when said instructions are not received at said third step;

(e) a fifth step of specifying a device, which has been just announced, when said instruction are received at said third step;

(f) a sixth step of emitting vocal announcement indicative of said plurality of manipulative elements of said specified device in a sequence from a first manipulative element, to said compartment;

(g) a seventh step of determining whether instructions from said operator responding to said vocal announcement of said sixth step is received within a predetermined period of time after said vocal announcement of said sixth step;

(h) an eighth step of emitting vocal announcement indicative of a next manipulative element to said compartment when said instructions are not received at said sixth step;

(i) a ninth step of changing the operating condition of said manipulative element, which has been just announced, when said instructions are received at said seventh step.

20. A method as claimed in claim 19, further comprising the step of terminating automatic change operations when said instructions are not received within said predetermined period of time after announcement of a last device in said third step.

21. Apparatus as claimed in claim 20, wherein said means responsive to the action comprises a sound recognizer which detects a predetermined vocal demand from said operator.

22. Apparatus as claimed in claim 20, wherein said vocal announcements emitting means comprises a sound synthesizer which produces vocal sounds by reading out contents of a predetermined region of a memory.

23. Apparatus as claimed in claim 20, wherein said means responsive to said responsive instructions comprises a sound recognizer which detects a predetermined vocal word from said operator.

24. A method as claimed in claim 19, further comprising the step of terminating automatic change operations when said instructions are not received within said predetermined period of time after announcement of a last manipulative element in said seventh step.

25. A method as claimed in claim 19, wherein said first step is performed by detecting a predetermined condition of a manually operable switch.

26. A method as claimed in claim 19, wherein said first step is performed by detecting a predetermined vocal demand from said passenger.

27. A method as claimed in claim 19, wherein said step of emitting vocal announcements comprises a step of synthesizing at least one predetermined vocal word by selectively reading the contents of a memory in which data corresponding to various vocal words indicative of said manipulations is stored respectively in a plurality of regions of said memory.

28. A method as claimed in claim 19, wherein said third step is performed by detecting a predetermined condition of a manually operable switch.

29. A method as claimed in claim 19, wherein said third step is performed by detecting a predetermined vocal demand from said passenger.

30. A method as claimed in claim 19, wherein said operating conditions to be controlled includes on/off operation, tuning and sound volume control of a radio mounted on a motor vehicle.

31. A method as claimed in claim 19, wherein said operating conditions to be controlled includes on/off operation and sound volume control of a stereo unit mounted on a motor vehicle.

32. A method as claimed in claim 19, wherein said operating conditions to be controlled includes on/off operation, temperature adjustment, airflow rate control and air outlet switching of an air conditioning system mounted on a motor vehicle.

33. Apparatus for controlling a plurality of devices mounted on a motor vehicle for automatically changing operating conditions of a plurality of manipulative elements inherent to each of said devices by designating a particular device among said plurality of devices, comprising:
(a) a first means for detecting start-indication from a passenger of said motor vehicle, which start-indication is indicative of a demand for effecting automatic change;
(b) a second means for emitting vocal announcement indicative of said plurality of devices in sequence from a first device to a compartment of said motor vehicle, where the order of said devices to be announced is predetermined;
(c) a third means for determining whether instructions from said operator responding to said vocal announcement from said second means is received within a predetermined period of time after said vocal announcement;
(d) a fourth means for emitting vocal announcement indicative of a next device to said compartment when said instructions are not received by said third means;
(e) a fifth means for specifying a device, which has been just announced, when said instructions are received by said third means;
(f) a sixth means for emitting vocal announcement indicative of said plurality of manipulative elements of said specified device in a sequence from a first manipulative element, to said compartment;
(g) a seventh means for determining whether instructions from said operator responding to said vocal announcement from said sixth means is received within a predetermined period of time after said vocal announcement from said sixth means;
(h) an eighth means for emitting vocal announcement indicative of a next manipulative element to said compartment when said instructions are not received by said sixth means;
(i) a ninth means for changing the operating condition of said manipulative element, which has been just announced, when said instructions are received by said seventh means.

34. Apparatus as claimed in claim 33, further comprising a manual switch for receiving said instructions from said passenger.

35. Apparatus as claimed in claim 34, further comprising means for continuously changing the operating condition of said manipulative element, whose operating condition is to change continuously in proportion to a period of time for which said manual switch is being operated.

* * * * *